United States Patent
Wang et al.

(10) Patent No.: US 6,914,313 B2
(45) Date of Patent: Jul. 5, 2005

(54) PROCESS FOR INTEGRATION OF A HIGH DIELECTRIC CONSTANT GATE INSULATOR LAYER IN A CMOS DEVICE

(75) Inventors: Ming-Fang Wang, Taichung (TW); Chien-Hao Chen, Ilan (TW); Liang-Gi Yao, Hsing-Chu (TW); Shih-Chang Chen, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/696,007

(22) Filed: Oct. 29, 2003

(65) Prior Publication Data

US 2004/0087075 A1 May 6, 2004

Related U.S. Application Data

(62) Division of application No. 10/146,287, filed on May 15, 2002, now Pat. No. 6,656,764.

(51) Int. Cl.[7] .............................................. H01L 29/76
(52) U.S. Cl. ..................... 257/410; 257/369; 257/408; 257/900
(58) Field of Search ................................. 257/410, 369, 257/401, 384, 408, 900

(56) References Cited

U.S. PATENT DOCUMENTS

| 5,491,099 A | 2/1996 | Hsu ........................... 437/35 |
| 5,880,499 A | 3/1999 | Oyama ........................ 257/316 |
| 5,970,329 A | 10/1999 | Cha ........................... 438/197 |
| 5,972,762 A | 10/1999 | Wu ............................ 438/305 |
| 6,656,764 B1 * | 12/2003 | Wang et al. ................. 438/104 |
| 2004/0087075 A1 * | 5/2004 | Wang et al. ................. 438/199 |

* cited by examiner

Primary Examiner—Mark V. Prenty
(74) Attorney, Agent, or Firm—Haynes and Boone, LLP

(57) ABSTRACT

A CMOS device structure, and a method of fabricating the CMOS device, featuring a gate insulator layer comprised of a high k metal oxide layer, has been developed. The process features formation of recessed, heavily doped source/drain regions, and of vertical, polysilicon LDD spacers, prior to deposition of the high k metal oxide layer. Removal of a silicon nitride shape, previously used as a mask for definition of the recessed regions, which in turn are used for accommodation of the heavily doped source/drain regions, provides the space to be occupied by the high k metal oxide layer. The integrity of the high k, gate insulator layer, butted by the vertical polysilicon spacers, and overlying a channel region provided by the non-recessed portion of the semiconductor substrate, is preserved via delayed deposition of the metal oxide layer, performed after high temperature anneals such as the activation anneal for heavily doped source/drain regions, as well as the anneal used for metal silicide formation.

12 Claims, 10 Drawing Sheets

PROCESS FOR INTEGRATION OF A HIGH DIELECTRIC CONSTANT GATE INSULATOR LAYER IN A CMOS DEVICE

This is a division of U.S. Ser. No. 10/146,287 filed May 15, 2002 and entitled "Process For integration Of A High Dielectric Constant Gate Insulator Layer In A CMOS Device" (now U.S. Pat. No. 6,656,764 issued Dec. 2, 2003).

BACKGROUND OF THE INVENTION (1) Field of the Invention

The present invention relates to methods used to fabricate semiconductor devices, and more specifically to a method used to integrate a gate insulator layer, comprised of a high dielectric constant (high k), material, into a CMOS device process sequence.

(2) Description of Prior Art

The advent of micro-miniaturization, or the ability to fabricate semiconductor devices with sub-micron features, has allowed device performance, as well as processing costs, to be reduced. The use of sub-micron features has resulted in reductions in performance degrading parasitic capacitances, while a greater amount of smaller semiconductor chips, comprised with sub-micron features, can now be obtained from a specific size substrate, thus reducing the processing cost for a specific semiconductor chip. The continuous scaling down of device dimensions necessitates the use of thinner gate insulator layers, and as the thickness of silicon dioxide layers used as a gate insulator layer decreases, integrity and leakage concerns, not present for gate insulator layers comprised of thicker silicon dioxide layers, become evident. The use of high k dielectric layers as gate insulator layers allow thicker layers to be used, with the thicker, high k dielectric layer supplying capacitances equal to thinner silicon oxide layers, or with the high k dielectric layer having an equivalent oxide thickness (EOT), equal to the thinner silicon dioxide counterpart layer. Therefore the use of high k dielectric layers, for gate insulator layer, will offer reduced leakage when compared to the thicker silicon dioxide gate insulator counterparts.

Metal oxide layers, such as aluminum oxide ($Al_2O_3$), zirconium oxide ($ZrO_2$), and hafnium oxide ($HfO_2$), are examples of high k dielectric layers, attractive as gate insulator layers for sub-micron devices, however the thermal stability of the metal oxide layers can be a problem when a gate metal insulator is formed prior to subsequent processing steps such as source/drain activation anneals, and metal silicide formation. The temperatures reached during these procedures can result in crystallization of the high k, metal oxide layer, resulting in undesirable gate leakage or shorts. This invention will describe a novel process procedure, and device structure, in which a high k, metal oxide layer is used as the device gate insulator layer, however formed and defined after high temperature anneals, and silicide formation procedures. Prior art, such as Wu, in U.S. Pat. No. 5,972,762, as well as Cha, in U.S. Pat. No. 5,970,329, describe methods of forming recessed elements in metal oxide semiconductor field effect (MOSFET), devices, however these prior arts do not describe the novel device process sequence, and novel process structure, illustrated in this present invention in which a device gate insulator layer, comprised of a high k, metal oxide layer, is integrated into a CMOS device process sequence after high temperature processes have been completed.

SUMMARY OF THE INVENTION

It is an object of this invention to fabricate a complimentary metal oxide semiconductor (CMOS) device featuring a high k dielectric layer for use as a gate insulator layer.

It is another object of this invention to integrate a high k, metal oxide, gate layer, into a CMOS fabrication sequence, after high temperature source/drain anneals, and high temperature metal suicide layer formation procedures, have been performed.

It is still another object of this invention to form the high k, metal oxide gate layer in a space surrounded by lightly doped source/drain (LDD), silicon spacers, wherein the space was created by removal of a silicon nitride masking shape, which in turn is used to define recessed source/drain regions as well as to define word lines.

In accordance with the present invention a method of integrating the formation of a high k, gate insulator layer into a CMOS fabrication procedure, at a stage of the CMOS fabrication procedure after which high temperature procedures have already been performed, is described. After formation of an N well, and of a P well region, for accommodation of P channel (PMOS), and N channel (NMOS), devices, a silicon nitride shape is formed on the surface of the well regions and used as a mask to selectively remove, and recess, unprotected silicon regions. Heavily doped P type, and N type, source/drain regions are then formed in the recessed portions in the P and N well regions, via ion implantation and annealing procedures, used to activate the implanted ions. Deposition of in situ doped polysilicon layers, and dry etching procedures, result in the formation of P type, and N type, lightly doped source/drain (LDD), spacers, on the sides of the silicon nitride shapes, as well as on the sides of the non-recessed silicon shapes, underlying the silicon nitride masking shapes. Metal silicide regions are next formed in portions of both the P type, and N type heavily doped source/drain region, via formation of a metal shape followed by anneal procedure. After formation of a planarizing insulator layer, the silicon nitride shapes are removed, exposing the surrounding LDD spacers, and exposing underlying non-recessed silicon, located between he heavily doped source/drain regions. A high k, metal oxide layer is deposited, filling the space vacated by the silicon nitride shape, followed by deposition of a conductive layer. Patterning procedures are used to define a conductive gate structure, overlying the high k, metal oxide gate insulator layer. Deposition of, and planarization of, an overlying insulator layer, is followed by definition of contact openings in the insulator layer, exposing portions of top surfaces of the recessed, highly doped source/drain regions, as well as portions of the top surface of the conductive gate structures. Deposition of, and patterning of, a metal layer, results in creation of metal contact and interconnect structures located in the contact openings.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
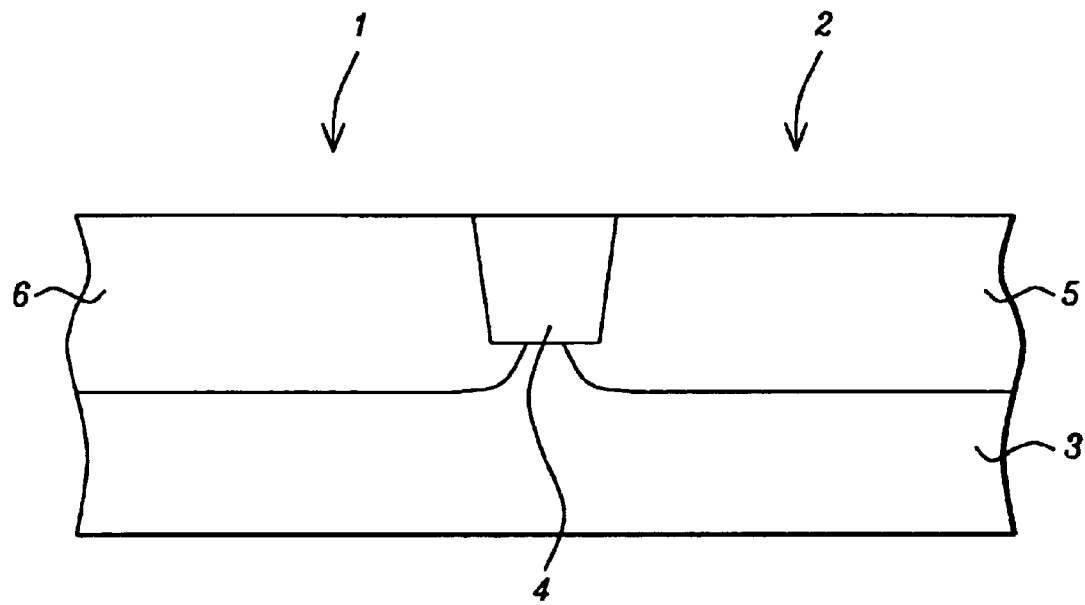
FIGS. 1–19, which schematically, in cross-sectional style, describe key stages of fabrication used to integrate the formation of a high k, gate layer into a CMOS fabrication procedure, at a stage of the CMOS fabrication procedure at which high temperature procedures, such as source/drain anneal, and metal silicide formation, have previously been performed.

The method of forming a complimentary metal oxide semiconductor (CMOS) device featuring a high k, gate insulator layer, integrating into the CMOS fabrication procedure after high temperature procedures, such as source/drain anneal, and metal silicide formation, have previously been performed, will now be described in detail. Semiconductor substrate 3, comprised of single crystalline P type silicon, featuring a <100> crystallographic orientation, is used and schematically shown in FIG. 1. Region 1, of semiconductor substrate 3, will be used for accommodation of P channel metal oxide semiconductor (PMOS), devices, while region 2, will be used for accommodation of N channel metal oxide semiconductor (NMOS), devices. Insulator filled, shallow trench isolation (STI), region 4, is formed in a top portion of semiconductor substrate 3, featuring formation of a shallow trench shape in semiconductor substrate 3, accomplished via photolithographic and dry etching procedures, followed by filling of the shallow trench shape with a silicon oxide layer, in turn obtained via low pressure chemical vapor deposition (LPCVD), or plasma enhanced chemical vapor deposition (PECVD), procedures, using tetraethylorthosilicate (TEOS), as a source. Removal of portions of the silicon oxide layer from the top surface of semiconductor substrate 3, is selectively accomplished via chemical mechanical polishing (CMP) procedures. A photoresist shape, (not shown in the drawings), is used to block out PMOS region 1, from a procedure used to form P well region 5, in NMOS region 2. This is accomplished via implantation of boron, or $BF_2$ ions, at an energy between about 150 to 250 KeV, at dose between about 1E13 to 1E14 atoms/cm$^2$. After removal of the photoresist shape used to protect PMOS region 1, from P well implantation procedures, another photoresist shape, (not shown in the drawings), is used to protect NMOS region 2, from implantation of arsenic or phosphorous ions, implanted at an energy between about 300 to 600 KeV, and at a dose between about 1E13 to 1E14 atoms/cm$^2$, allowing formation of N well region 6, to be formed in PMOS region 1. After removal of the NMOS region 2, photoresist block out shape, an anneal procedure is performed at a temperature between about 700 to 1000° C., employed to activate the implanted ions in both well regions. The result of these procedures is schematically shown in FIG. 1.

Figure 2:
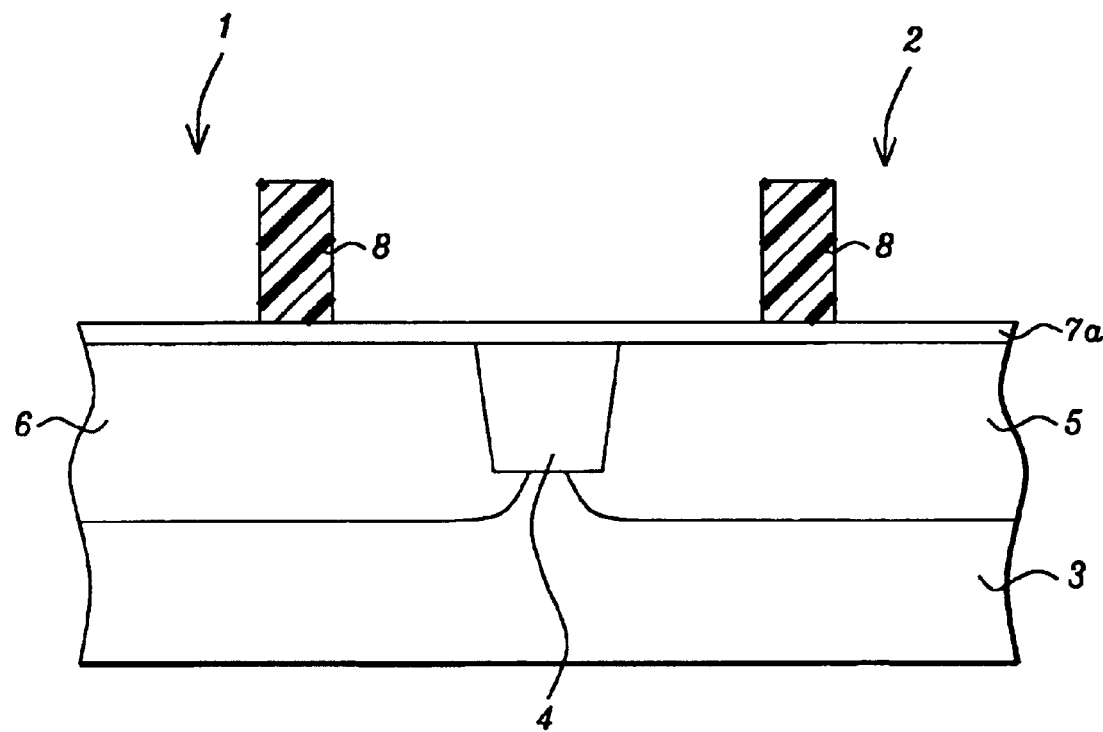
Figure 3:
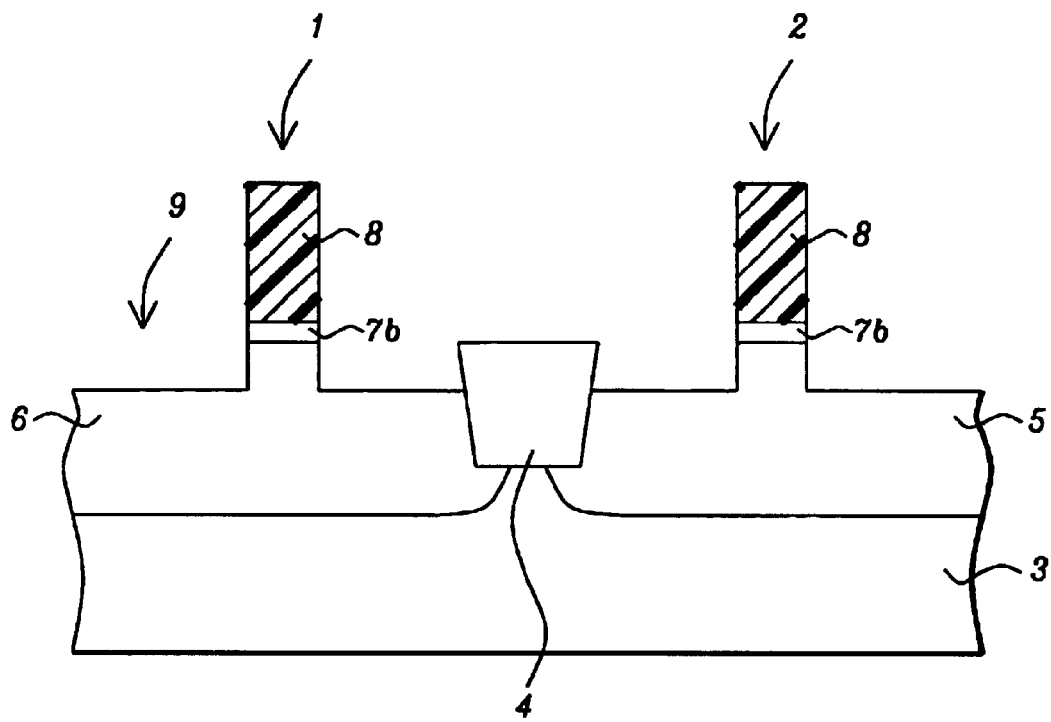

Silicon nitride layer 7a, is next deposited via LPCVD or PECVD procedures, at a thickness between about 10 to 500 Angstroms. If desired a composite layer, comprised of the silicon nitride layer on an underlying silicon oxide layer, can be use in place of silicon nitride layer 7a. Photoresist shapes 8, each comprised with a width or diameter between about 1000 to 5000 Angstroms, are next formed on silicon nitride layer 7a. This is schematically shown in FIG. 2. An anisotropic RIE procedure, using $CF_4$ or $Cl_2$ as an etchant, is first used to define silicon nitride shapes 7b, using photoresist shapes 8, as a mask. The anisotropic RIE procedure is then continued, using $Cl_2$ or $SF_6$ as an etchant for silicon, to selectively remove portions of semiconductor substrate 3, not protected by photoresist shapes 8, or occupied by STI region 4, creating recessed regions 9, in both PMOS region 1, and in NMOS region 2. The depth of recessed regions 9, in semiconductor substrate 3, is between about 100 to 100,000 Angstroms. This is schematically shown in FIG. 3. Photoresist shapes 8, are then removed via plasma oxygen ashing and careful wet cleans.

Figure 4:
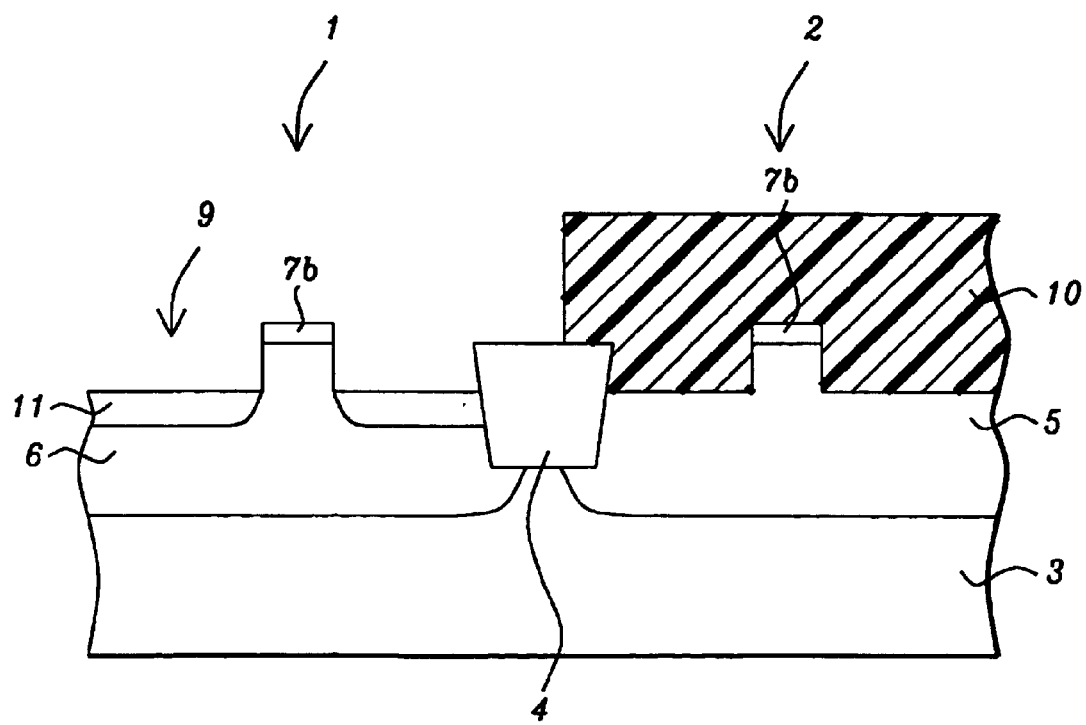
Figure 5:
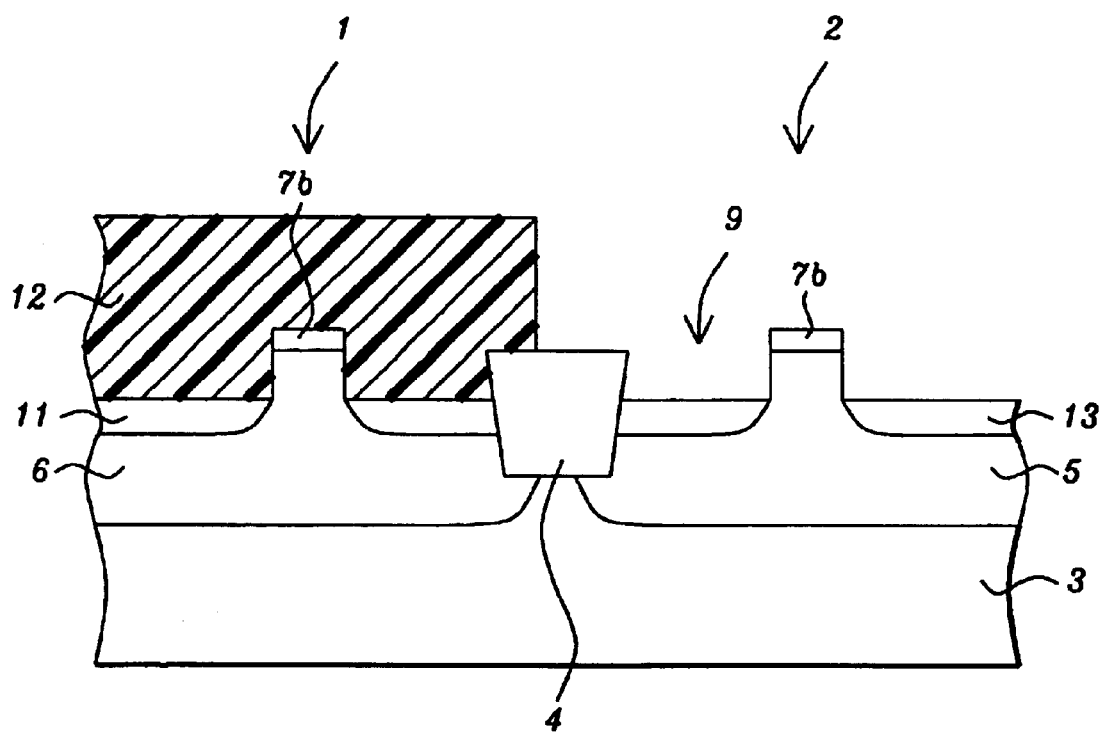

The formation of heavily doped P type, and N type source/drain regions, in the recessed regions of semiconductor substrate 3, is next addressed, and schematically described using FIGS. 4–5. Photoresist shape 10, is used as to protect NMOS region 2, from implantation of boron or $BF_2$ ions, used to form heavily doped P type source/drain region 11, in a top portion of recessed regions 9, or N well region 6, located in PMOS region 1. The implantation procedure is performed at an energy between about 1 to 50 KeV, at a dose between about 1E12 to 5E12 atoms/cm$^2$. After removal of photoresist shape 10, via plasma oxygen ashing, photoresist block out shape 12, is defined, protecting PMOS region 1, from implantation of N type ions, used to from heavily doped source/drain region 13, in a top portion of recessed region 9, or in P well region 5, located in NMOS region 2. Formation of heavily doped N type source/drain region 13, is accomplished via implantation of arsenic or phosphorous ions, at an energy between about 10 to 150 KeV, at a dose between about 1E12 to 1E16 atoms/cm$^2$ After removal of photoresist shape 12, via plasma oxygen ashing procedures, an anneal procedure is performed at a temperature between about 500 to 1100° C., for a time between about 0 to 240 min, for purposes of activated the implanted ions in both heavily doped source/drain regions. The anneal procedure can be performed using either conventional furnace, or rapid thermal anneal procedures. In addition the ion activating anneal procedure can be performed after deposition of a subsequent silicon oxide layer, or the activation of the implanted ions can occur during the deposition of the subsequent silicon oxide layer.

Figure 6:
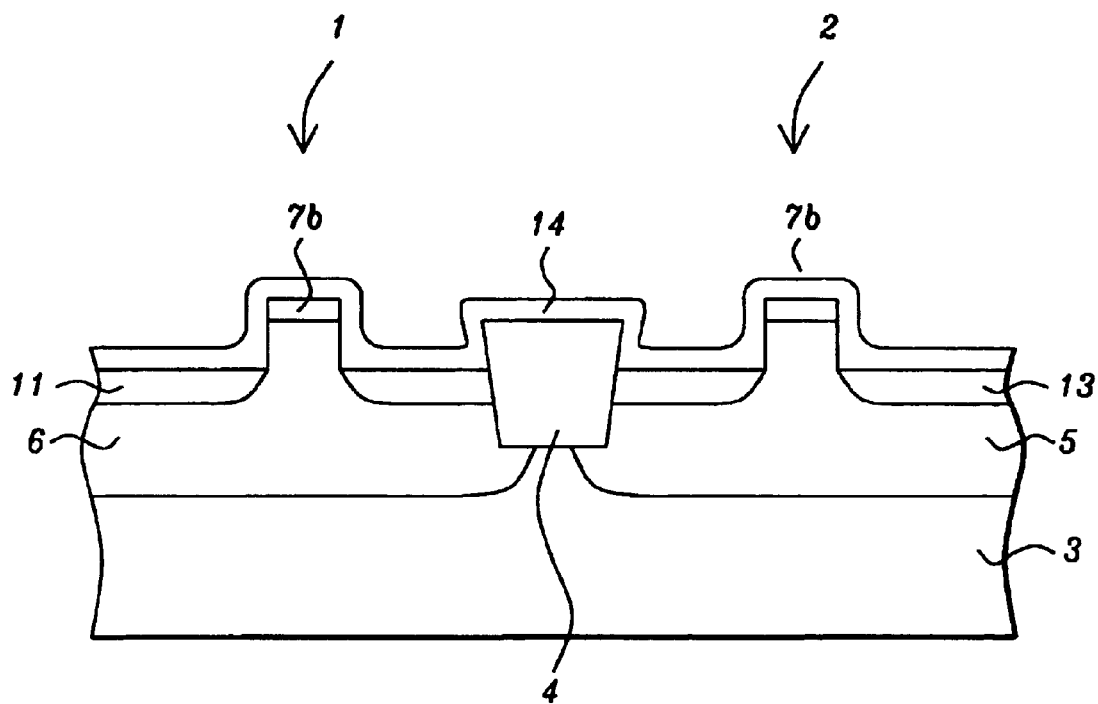
Figure 7:
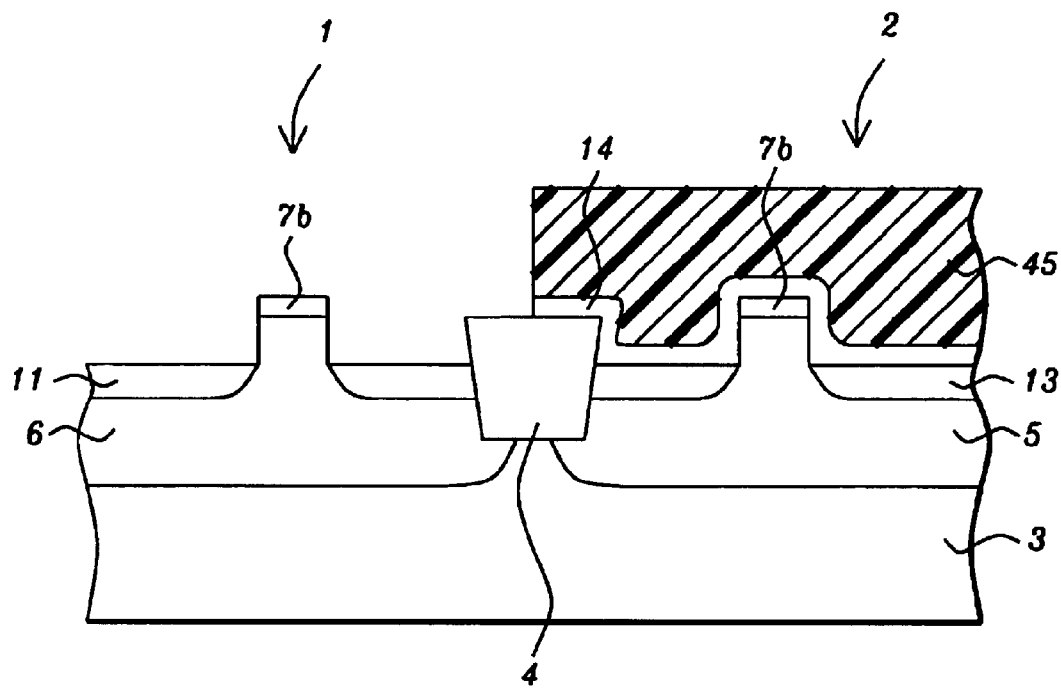

Silicon oxide layer 14, shown schematically in FIG. 6, is next deposited via LPCVD or PECVD procedures, at a thickness between about 50 to 10,000 Angstroms, using a deposition temperature between about 300 to 700° C. Photoresist shape 45, is then employed as a masking shape, allowing the portions of silicon oxide layer 14, to be entirely removed in PMOS region 1. This is schematically shown in FIG. 7. Removal of exposed portions of silicon oxide layer 14, is accomplished either via wet etch procedures using a buffered hydrofluoric (BHF), or a dilute hydrofluoric (DHF), acid as etchant, or via an isotropic dry etch procedure, using $CHF_3$ as an etchant. Photoresist shape 45, is then removed again via use of plasma oxygen ashing procedures.

Figure 8:
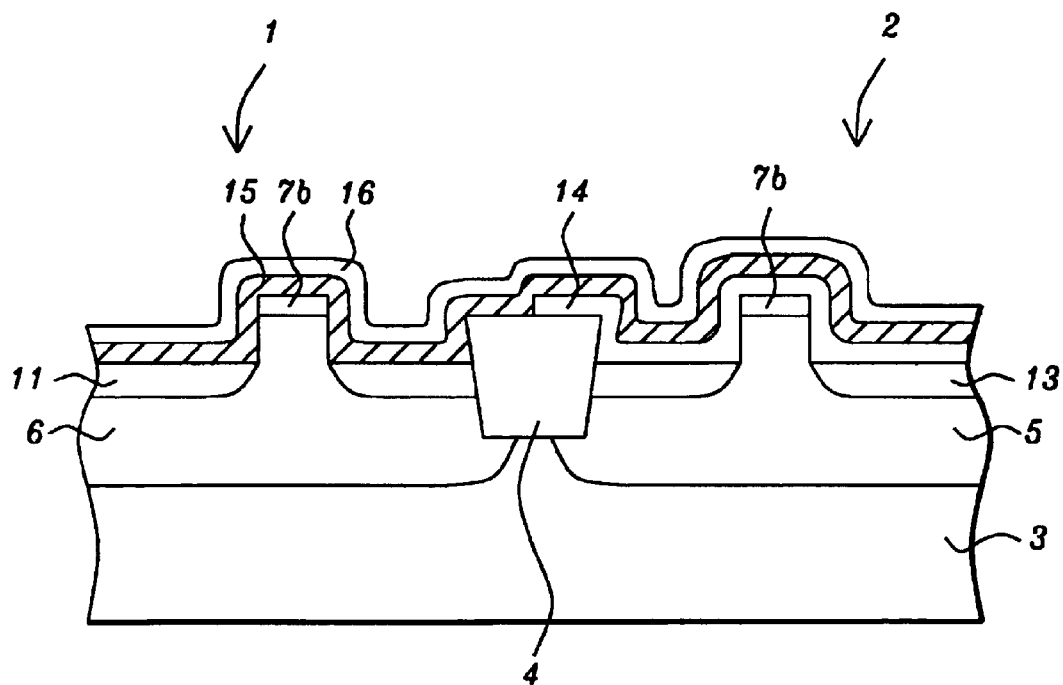
Figure 9:
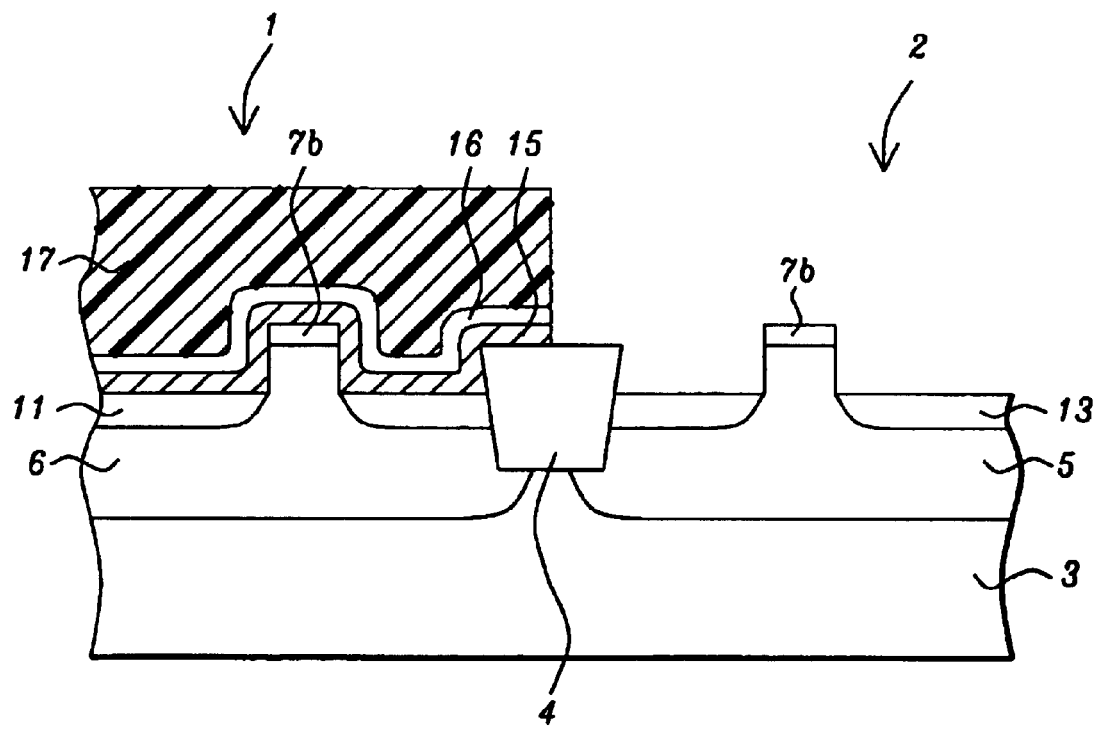

Polysilicon, or silicon layer 15, is next deposited via LPCVD procedures at a thickness between about 100 to 5000 Angstroms. Polysilicon layer 15, is in situ doped during deposition via the addition of diborane to a silane ambient. Polysilicon layer 15, directly interfaces the sides of the silicon nitride shape 7b, as well as the sides of the non-recessed portion of semiconductor substrate 3, in PMOS region 1, while silicon oxide layer 14, prevents direct overlay of polysilicon layer 15, to silicon nitride shape 7b, and to the non-recessed portion of semiconductor substrate 3, located in NMOS region 2. After deposition of polysilicon layer 15, silicon oxide layer 16, is deposited via LPCVD or PECVD procedures, at a thickness between about 50 to 10,000 Angstroms. The result of these depositions is schematically shown in FIG. 8. Photoresist shape 17, is next defined and used as an etch mask to protect PMOS region 1, from etching procedures used to remove exposed portions of silicon oxide layer 16, polysilicon layer 15, and silicon oxide layer 14, located in NMOS region 2. This is accomplished via isotropic RIE procedures using $CHF_3$ as an etchant for silicon oxide layer 16, and silicon oxide layer 14, while $Cl_2$ or $SF_6$ is used as an etchant for polysilicon layer 15. This is schematically shown in FIG. 9. Removal of photoresist shape 17, is accomplished via plasma oxygen ashing procedures.

Figure 10:
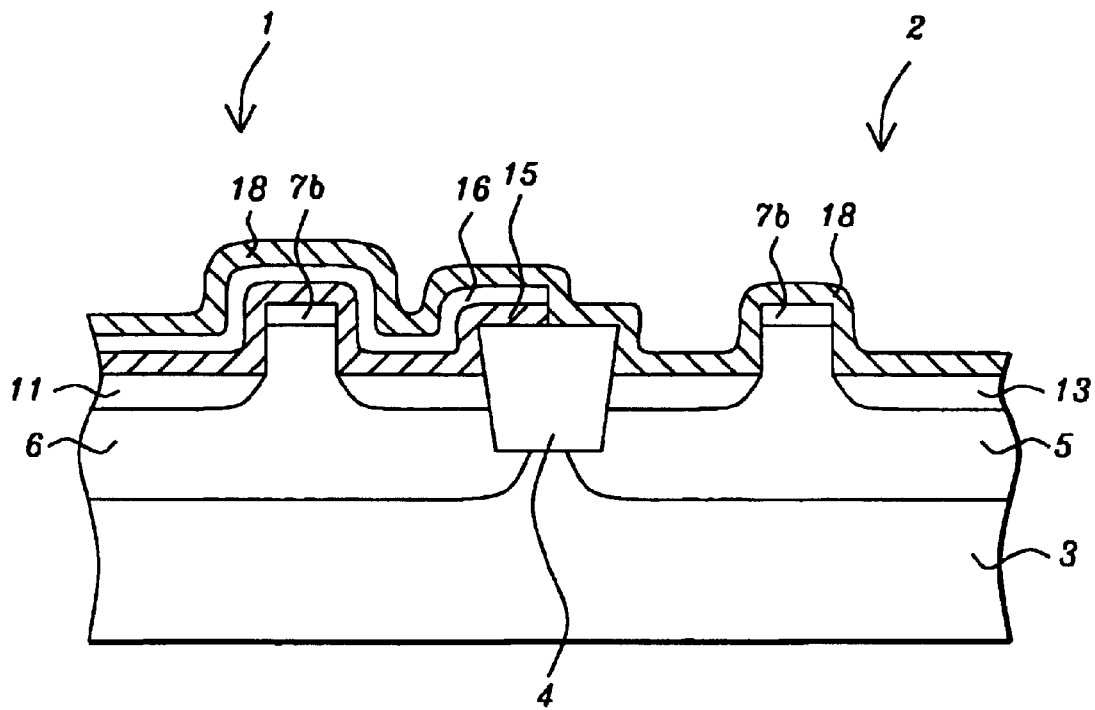
Figure 11:
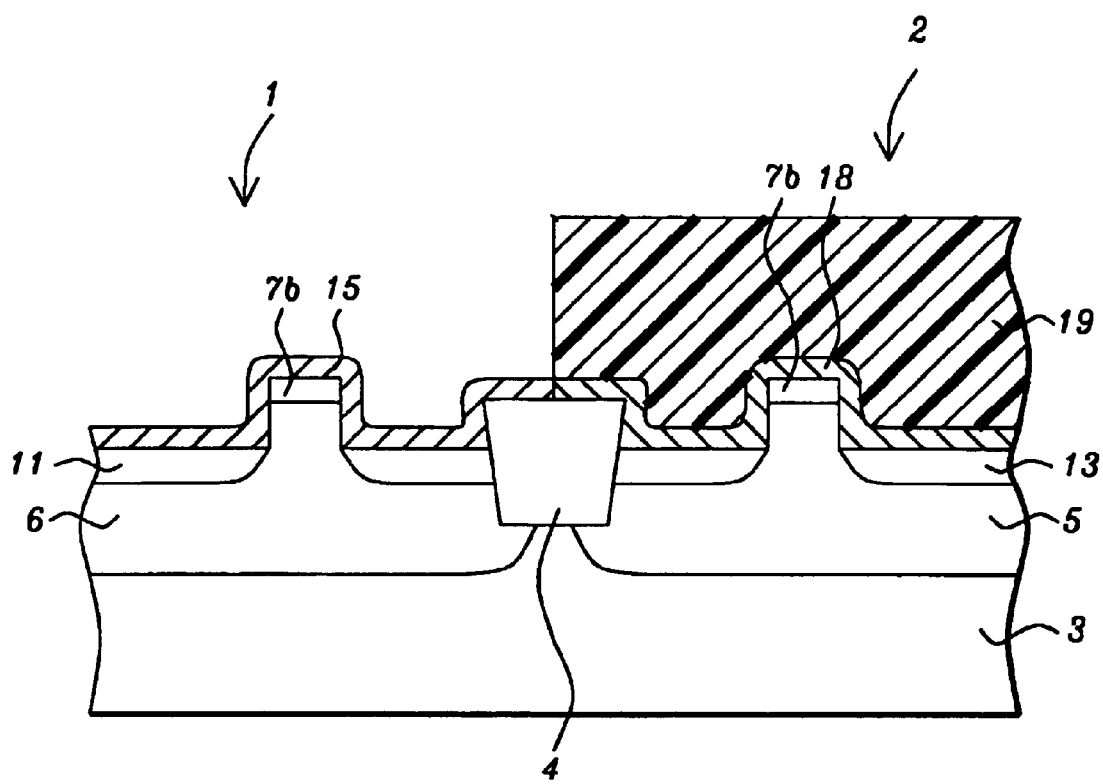

The removal of the silicon oxide and P type, in situ doped polysilicon from NMOS region 2, allows polysilicon layer 18, to now be deposited and to directly interface the sides of silicon nitride shape 7b, as well as the sides of the non-recessed portion of semiconductor substrate 3, located in NMOS region 2. Polysilicon layer 18, schematically shown in FIG. 10, is obtained via LPCVD procedures at a thickness between about 50 to 10,000 Angstroms, and is in situ doped via the addition of arsine, or phosphine, to a silane ambient. N type in situ doped polysilicon layer 18, is separated from underlying elements in PMOS region 1, via silicon oxide layer 16. Photoresist shape 19, is then used as a etch mask to allow portions of P type, in situ doped polysilicon layer 18, as well as the remaining portion of silicon oxide layer 16, to be removed in PMOS region 1. This is accomplished via selective, isotropic dry etch procedures, using $Cl_2$ or $SF_6$ as an etchant for exposed regions of N type, in situ doped polysilicon layer 18, while $CLIF_3$ is used as an etchant for the remaining portion of silicon oxide layer 16. The silicon oxide dry etching phase selectively terminates at the appearance of P type, in situ doped polysilicon layer 15. The result of these selective dry etch procedures is schematically shown in FIG. 11. Photoresist shape 19, is removed via plasma oxygen ashing procedures.

Figure 12:
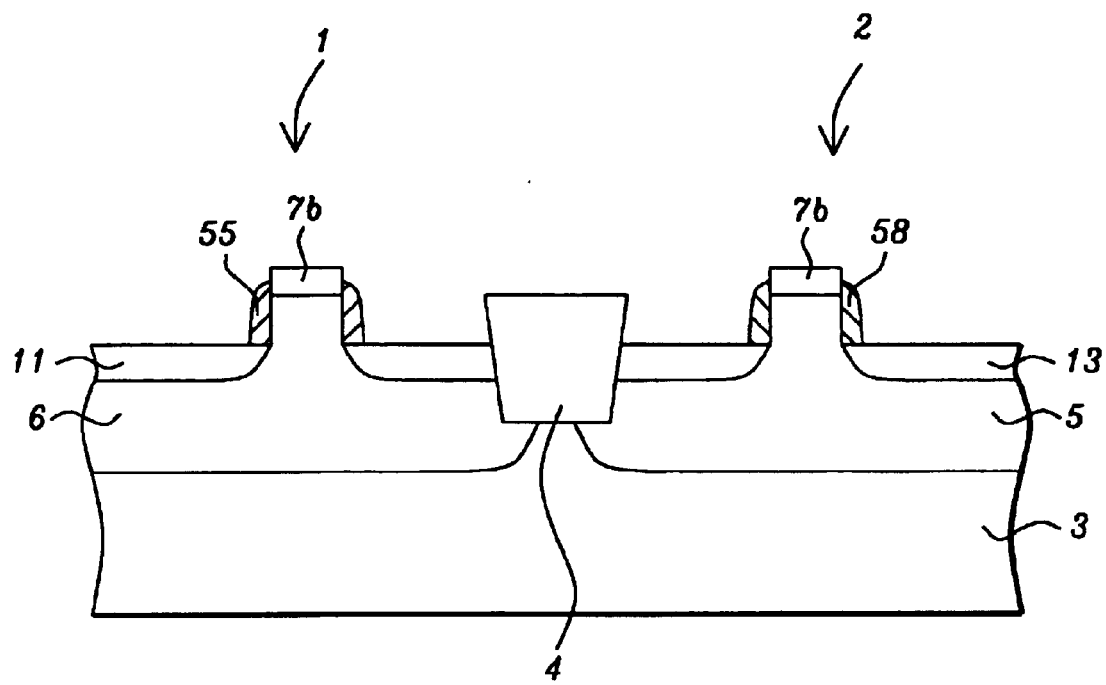

A critical, anisotropic RIE procedure is next performed, selectively removing portions of P type, in situ doped polysilicon layer 15, located in PMOS region 1, and portions of N type, in situ doped polysilicon layer 18, located in NMOS region 2. This is accomplished using $Cl_2$ or $SF_6$ as an etchant, resulting in the formation of P type polysilicon spacers 55, located on the sides of silicon nitride shape 7b, and on the sides of the non-recessed portion of semiconductor substrate 3, located in PMOS region 1, and resulting in the formation of N type polysilicon spacers 58, located on the sides of silicon nitride shape 7b, and on the sides of the non-recessed portion of semiconductor substrate 3, located in NMOS region 1. P type polysilicon spacers 55, will function as vertical, P type polysilicon, lightly doped source/drain (LDD), elements for the PMOS devices, while N type polysilicon spacers 58, will function as vertical, N type polysilicon, LDD elements for the subsequent NMOS devices. The over-etch cycle, used at the conclusion of the anisotropic RIE procedure used to define the spacers, results in recessing of the spacer structures, now positioned interfacing the center of the sides of silicon nitride shapes. The result of this procedure is schematically shown in FIG. 12.

Figure 13:
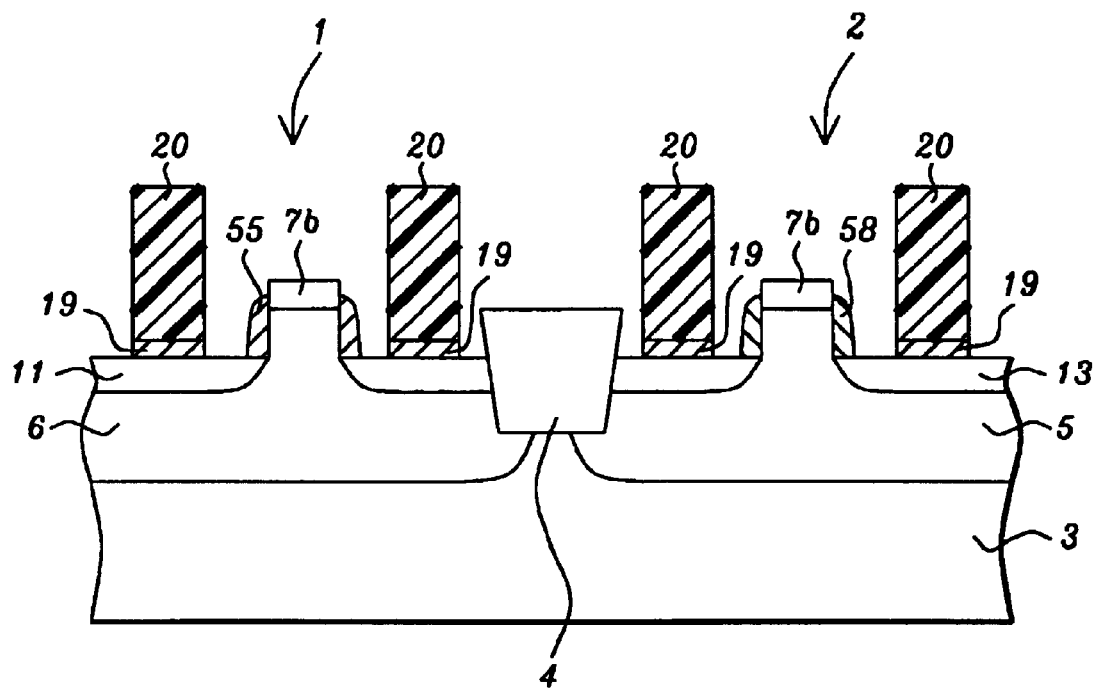
Figure 14:
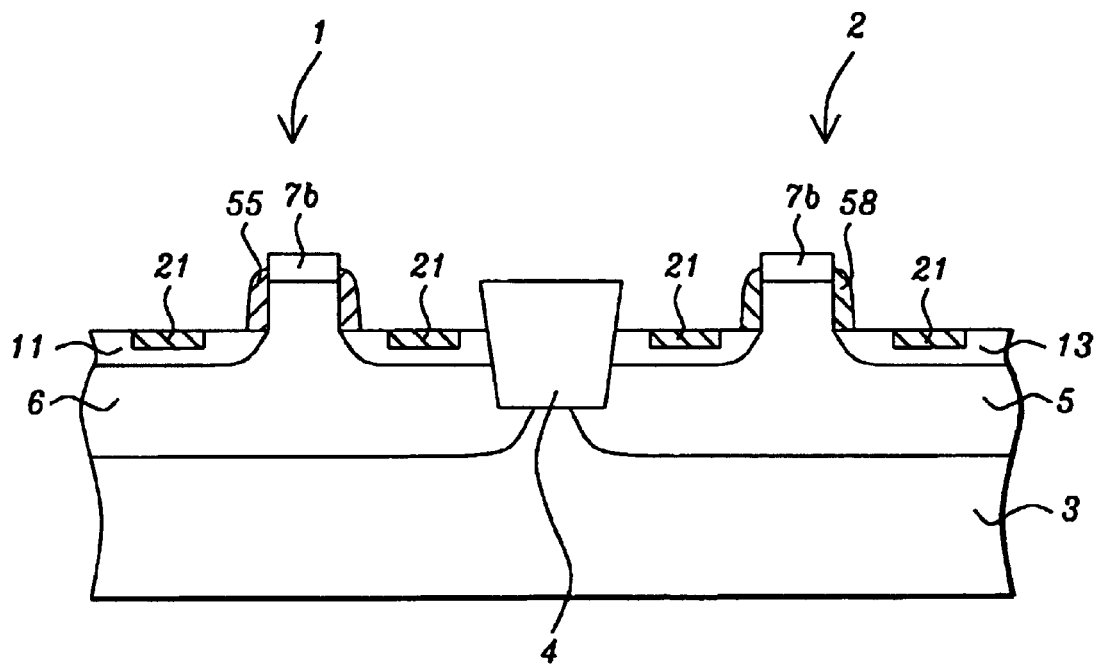

Formation of metal silicide layers on portions of both type heavily doped source/drain regions is next addressed and schematically described using FIGS. 13–14. A metal layer, comprised of either titanium, tungsten, tantalum, nickel, or cobalt, is deposited via plasma vapor deposition procedures at a thickness between about 50 to 2000 Angstroms. Photoresist shapes 20, are next formed on the blanket metal layer and used as an etch mask to allow an anisotropic RIE procedure, using $Cl_2$ as an etchant, to define metal shapes 19, overlying specific portions of the underlying, heavily doped source/drain regions. After removal of photoresist shapes 20, via plasma oxygen ashing, an anneal procedure is used to form metal silicide regions 21, via consumption of portions of the heavily doped source/drain regions. The anneal procedure can be performed using a rapid thermal anneal (RTA) procedure, at a temperature between about 200 to 800° C., for a time between about 0 to 30 min, in an inert ambient, or performed via conventional furnace procedures at a temperature between about 200 to 800° C., for a time between about 0 to 240 min, again performed in an inert ambient. Metal silicide regions 21, are then comprised of titanium silicide, tungsten silicide, tantalum silicide, nickel silicide, or cobalt silicide.

Figure 15:
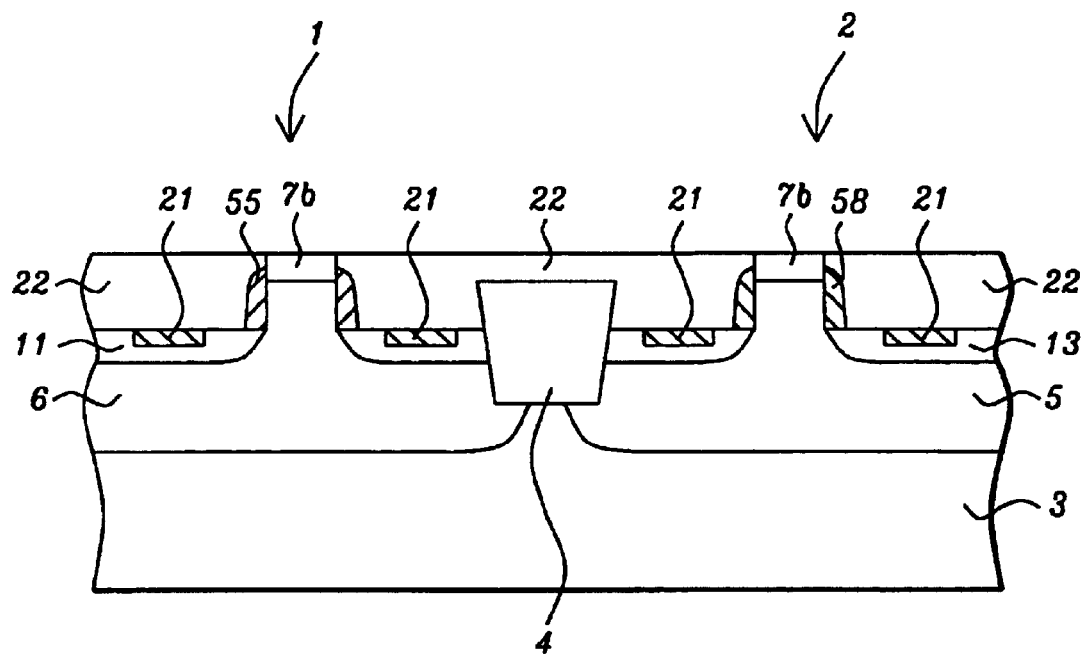
Figure 16:
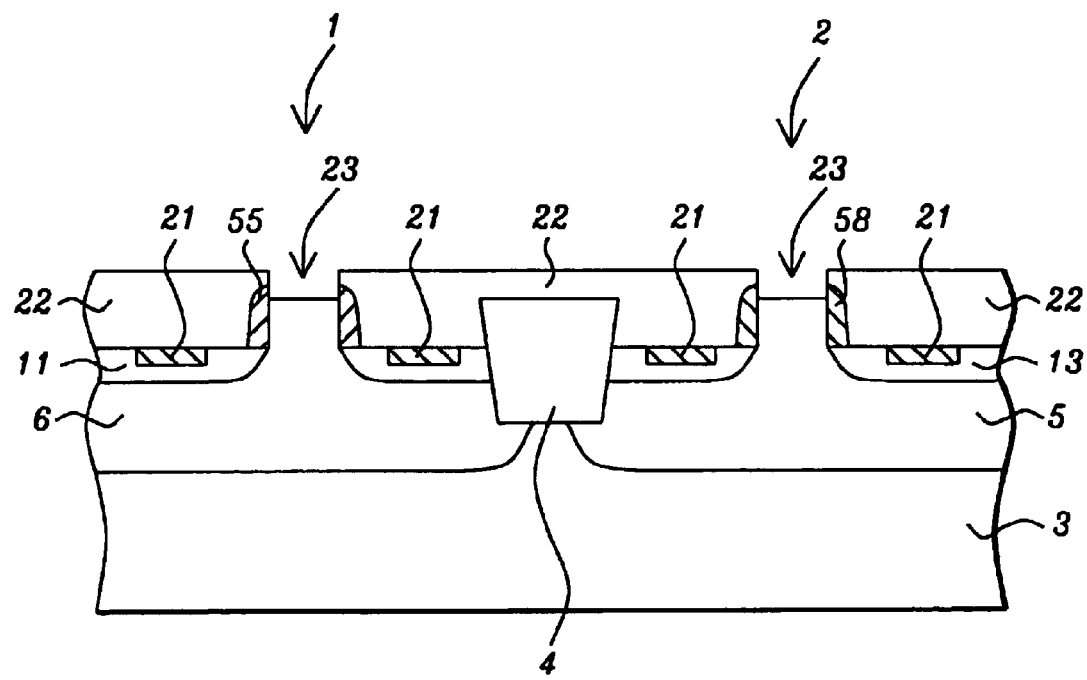

Insulator layer 22, comprised of a low k layer such as silicon oxide, boro-phosphosilicate glass (BPSG), or phosphosilicate glass (PSG), is next deposited via LPCVD or PECVD procedures, to a thickness between about 1000 to 100,000 Angstroms. A chemical mechanical polishing (CMP), procedure is then used to planarize insulator layer 22, selectively terminating at the appearance of the top surface of silicon nitride shapes 7b. This is schematically shown in FIG. 15. Silicon nitride shapes 7b, are now selectively removed via a wet etch procedure, using a hot phosphoric acid solution. If desired silicon nitride shapes 7b, can be selectively removed via a dry etch procedure, using $Cl_2$ as a selective etchant for silicon nitride. The removal of silicon nitride shapes 7b, creates opening 23, exposing the underlying non-recessed portion of semiconductor substrate 3, and located surrounded by the top portions of LDD spacer elements, specifically P type polysilicon spacer 55, in PMOS region 1, and N type polysilicon spacer 58, located in NMOS region 2. This is schematically illustrated in FIG. 16.

Figure 17:
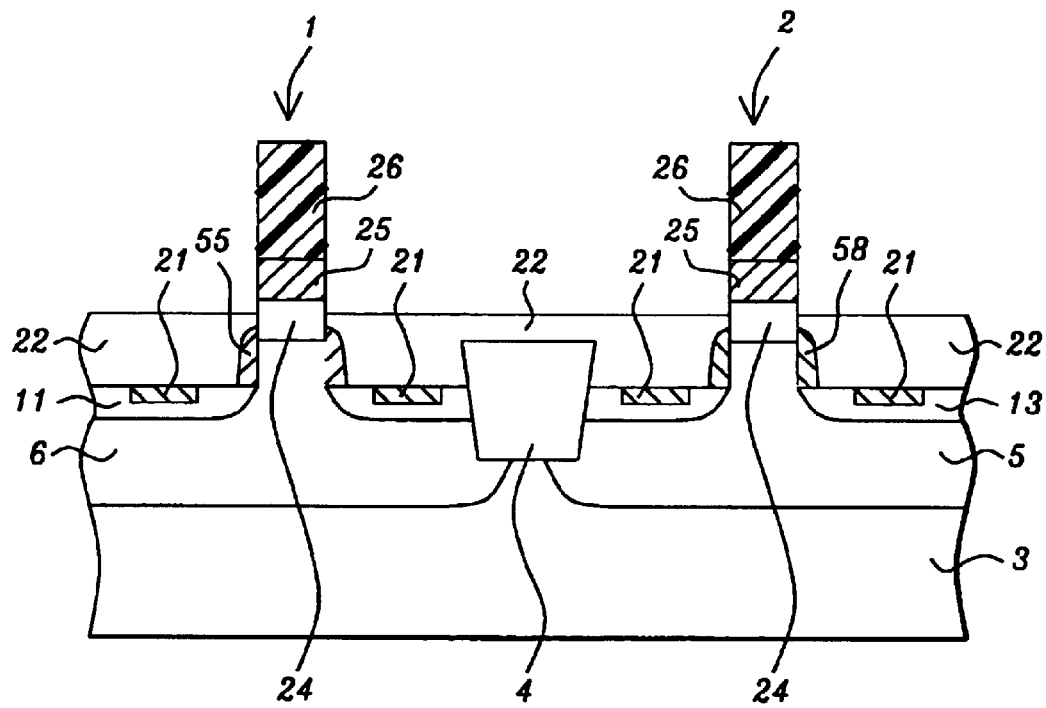

A critical deposition of high k metal oxide layer 24, is next accomplished via metal organic chemical vapor deposition (MOCVD), or via atomic layer chemical vapor deposition (ALCVD) procedures to a thickness between about 10 to 1000 Angstroms, at a temperature between about 100 to 1000° C., using $HfCl_4$, $ZrCl_4$, $AlCl_3$, as reactants for the ALCVD procedure, while using tetrakis dimethyl amino hafnium (TDMAH), or TDMAZ as reactants for the MOCVD procedure. High k metal oxide layer 24, featuring a dielectric constant between about 7 to 500, allows the use of a thicker layer. The higher dielectric constant layer allows an equivalent oxide thickness (EOT), equal to the thinner, lower k dielectric counterparts, to be realized. In addition the increased thickness, acceptable via use of the higher k dielectric layer, reduces the risk of gate insulator leakage or shorts, again when compared to thinner, low k dielectric layers. High k metal oxide layer 24, comprised of aluminum oxide ($Al_2O_3$), zirconium oxide ($ZrO_2$), or hafnium oxide ($HfO_2$), completely fills openings 23, with a portion of the high k dielectric layer residing on the top surface of insulator layer 22. Conductive layer 25, comprised of a metal, or metal silicide layer such as aluminum, aluminum-copper, copper, tungsten, or tungsten silicide, is next deposited on high k dielectric layer 24, via plasma vapor deposition procedures, at a thickness between about 100 to 10,000 Angstroms. If desired conductive layer 25, can be comprised of an in situ doped polysilicon layer. Photoresist shapes 26, are then formed and used as an etch mask to allow an anisotropic RIE procedure, to define the gate, or metal structure 25, as well as removing unprotected portions of high k dielectric layer 24. The anisotropic RIE procedure is performed using $Cl_2$ as a selective etchant for metal or metal suicide, while RF is used as an etchant for high k dielectric layer 24. The result of this procedure is schematically shown in FIG. 17. Each metal oxide semiconductor field effect transistor (MOSFET), device is now comprised of: lateral, heavily doped source/drain regions; lateral channel regions located in the non-recessed portion of semiconductor substrate 3, underlying a gate dielectric layer comprised of a high k dielectric layer; vertical LDD polysilicon spacers; and a conductive gate structure, self-aligned to the underlying high k dielectric layer.

Figure 18:
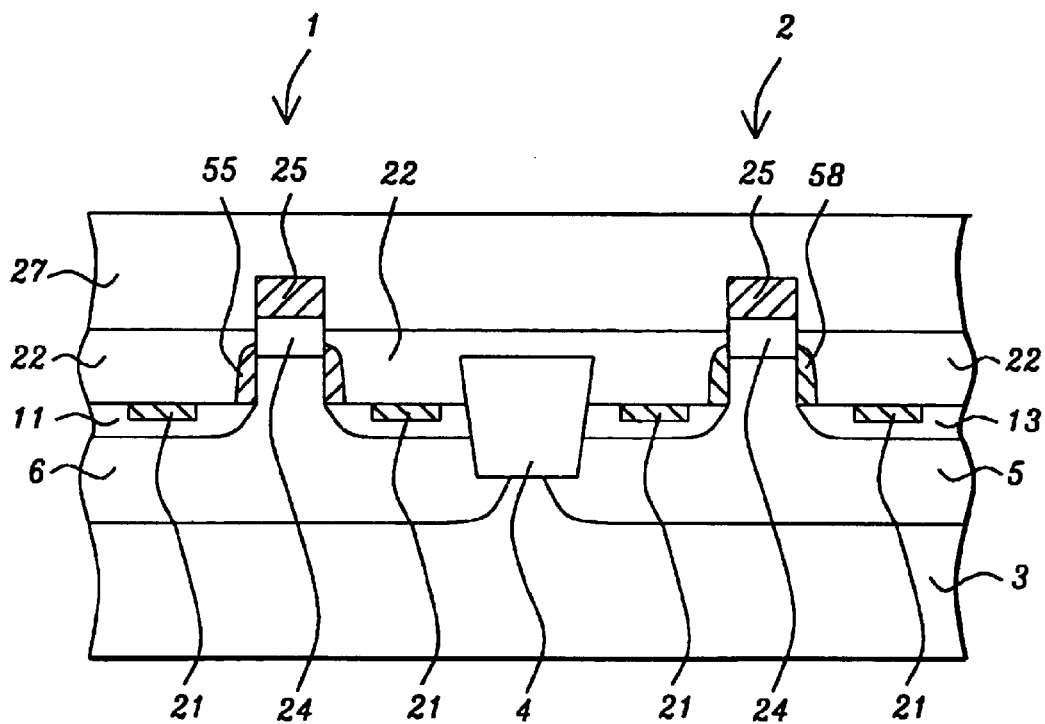
Figure 19:
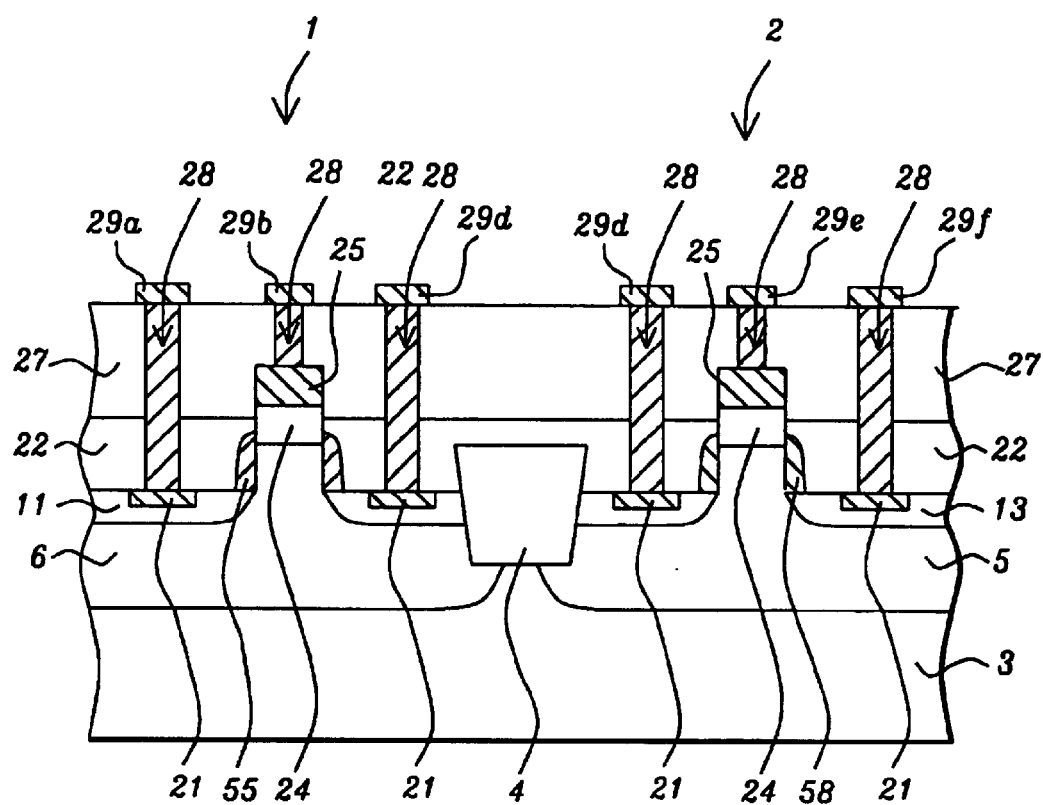

After removal of photoresist shapes 26, via plasma oxygen ashing, interlevel dielectric (ILD), layer 27, comprised of either BPSG, PSG, or silicon oxide, is deposited via LPCVD or PECVD procedures, at a thickness between about 100 to 10,000 Angstroms. This is schematically shown in FIG. 18. If desired ILD layer 27, can be subjected to a CMP procedure for planarization purposes. A photoresist shape (not shown in the drawings), is then used as a mask to allow an anisotropic RIE procedure to define contact hole openings 28, exposing portions of top surfaces of metal gate structures 25, as well as metal silicide regions 21, located in PMOS region 1, as well as in NMOS region 2. The anisotropic RIE procedure is performed using $CHF_3$ as a selective etchant for ILD layer 27, and for insulator layer 22. After removal of the photoresist shape used to define the contact hole openings, a metal layer such as aluminum, aluminum-copper, copper, or tungsten, is deposited via plasma vapor deposition procedures, completely filling all contact hole openings, as well as overlying the top surface of ILD layer 27. Another photoresist shape (not shown in the drawings), is formed and used as a mask to allow an anisotropic RIE procedure, using $Cl_2$ as an etchant, to define metal structures in contact hole openings 28. Metal structures 29a, 29b, and 29c, now communicate with a heavily doped source region, a metal gate structure, and a heavily doped drain region, respectfully, in PMOS region 1, while metal structures 29d, 29e, and 29f, are used for contact to a heavily doped source region, a metal gate structure, and a heavily doped drain region, respectfully, in NMOS region 2. The result of these procedures is schematically shown in FIG. 19. The photoresist shape used to define the metal structures is now removed via plasma oxygen ashing procedures.

While this invention has been particularly shown and described with reference to the preferred embodiments thereof, it will be understood by those skilled in the art that various changes in form and details may be made without departing from the spirit or scope of the invention.

What is claimed is:

1. A complimentary metal oxide semiconductor CMOS) device, featuring a P channel metal oxide semiconductor (PMOS) component in a first region of a semiconductor substrate, and featuring an N channel metal oxide semiconductor (NMOS) component in a second region of said semiconductor substrate, comprising:

a P well region located in a top portion of said second region of said semiconductor substrate, and an N well region located in a top portion of said first region of said semiconductor substrate;

an insulator filled, shallow trench isolation region, located in a top portion of said semiconductor substrate between said P well region and said N well region;

a recessed P well region located in the perimeter of said P well region, with a non-recessed P well portion of said semiconductor substrate located in the center of said P well region, surrounded by said recessed P well region;

a recessed N well region located in the perimeter of said N well region, with a non-recessed N well portion of said semiconductor substrate located in the center of said N well region, surrounded by said recessed N well region;

a heavily doped P type source/drain region, located in a top portion of said recessed N well region;

a heavily doped N type source/drain region, located in a top portion of said recessed P well region;

first metal silicide layers located in top portions of said heavily doped P type source/drain region, and second metal silicide layers located in top portions of said N type heavily doped source/drain region;

a first metal oxide gate insulator layer located overlying the top surface of said non-recessed P well portion of said semiconductor substrate, and a second metal oxide gate insulator layer overlying the top surface of said non-recessed N well portion of said semiconductor substrate;

vertical P type silicon spacers located on the sides of said non-recessed N well portion of said semiconductor substrate, and located on the sides of a bottom portion of said first metal oxide gate insulator layers;

vertical N type silicon spacers located on the sides of said non-recessed P well portion of said semiconductor substrate, and located on the sides of a bottom portion of said second metal oxide gate insulator layer;

conductive gate structures located overlying the metal oxide gate insulator layer;

an interlevel dielectric (ILD) layer located overlying said conductive gate structures;

contact hole openings in said ILD layer exposing top surface of said conductive gate structures, and exposing top surface of said heavily doped P type source/drain region, and of said heavily doped N type source/drain region; and metal structures located in said contact hole openings.

2. The CMOS device of claim 1, wherein the depth of said recessed P well region, located in the perimeter of said P well region, and of said recessed N well region, located in the perimeter of said N well region, is between about 100 to 100,000 Angstroms.

3. The CMOS device of claim 1, wherein said vertical P type silicon spacers, and said vertical N type silicon spacers, are comprised of polysilicon.

4. The CMOS device of claim 1, wherein said metal oxide gate insulator layers are comprised of either aluminum oxide ($Al_2O_3$), zirconium oxide ($ZrO_2$), or hafnium oxide ($HfO_2$), at a thickness between about 10 to 1000 Angstroms, and with said metal oxide gate insulator layers comprised with a dielectric constant between about 7 to 100.

5. The CMOS device of claim 1, wherein said conductive gate structures are comprised of either tungsten, aluminum, aluminum-copper, copper, tungsten silicide, or doped polysilicon.

6. A metal oxide semiconductor field effect transistor (MOSFET) device, comprising:
   a well region located in a top portion of a semiconductor substrate;
   a recessed well region located in the perimeter of said well region, with a non-recessed wall portion of said semiconductor substrate located in the center of said well region, surrounded by said recessed well region;
   a heavily doped source/drain region located in a top portion of said recessed well region;
   metal silicide layers located in top portions of said heavily doped source/drain region;
   a metal oxide gate insulator layer located overlying the top surface of said non-recessed well portion of said semiconductor substrate;
   vertical silicon spacers located on the sides of said non-recessed well portion of said semiconductor substrate, and located on the sides of a bottom portion of said metal oxide gate insulator layer;
   a conductive gate structure located overlying said metal oxide gate insulator layer;
   an interlevel dielectric (ILD) layer located overlying said conductive gate structure;
   contact hole openings in said ILD layer exposing top surface of said conductive gate structure, and exposing top surface of said heavily doped source/drain region; and
   metal structures located in said contact hole openings.

7. The MOSFET device of claim 6, wherein said well region is a P type well region.

8. The MOSFET device of claim 6, wherein said well region is an N type well region.

9. The MOSFET device of claim 6, wherein the depth of said recessed well region, located in the perimeter of said well region, is between about 100 to 100,000 Angstroms.

10. The MOSFET device of claim 6, wherein said vertical silicon spacers are comprised of either P type doped polysilicon or of N type doped polysilicon.

11. The MOSFET device of claim 6, wherein said metal oxide gate insulator layer is comprised of either aluminum oxide ($Al_2O_3$), zirconium oxide ($ZrO_2$), or hafnium oxide ($HfO_2$), eta thickness between about 10 to 1000 Angstroms, and with said metal oxide gate insulator layer comprised with a dielectric constant between about 7 to 100.

12. The MOSFET device of claim 6, wherein said conductive gate structure is comprised of either tungsten, aluminum, aluminum-copper, copper, tungsten silicide, or doped polysilicon.

* * * * *